(12) United States Patent
De Pena Hempel et al.

(10) Patent No.: US 10,434,725 B2
(45) Date of Patent: Oct. 8, 2019

(54) THREE-DIMENSIONAL OBJECT CONSTRUCTION

(71) Applicant: HEWLETT-PACKARD DEVELOPMENT COMPANY, L.P., Houston, TX (US)

(72) Inventors: Alejandro Manuel De Pena Hempel, Sant Cugat del Valles (ES); Ramon Vega Ainsa, Sabadell (ES); Xavier Bruch Pla, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 809 days.

(21) Appl. No.: 14/764,347

(22) PCT Filed: Apr. 30, 2013

(86) PCT No.: PCT/US2013/038759
§ 371 (c)(1),
(2) Date: Jul. 29, 2015

(87) PCT Pub. No.: WO2014/178834
PCT Pub. Date: Nov. 6, 2014

(65) Prior Publication Data
US 2015/0367572 A1    Dec. 24, 2015

(51) Int. Cl.
*B29C 67/00* (2017.01)
*G03F 7/00* (2006.01)
(Continued)

(52) U.S. Cl.
CPC ........ *B29C 67/0066* (2013.01); *B29C 64/124* (2017.08); *B29C 64/135* (2017.08);
(Continued)

(58) Field of Classification Search
CPC ......... B33Y 10/00; B33Y 30/00; B33Y 50/00; B33Y 50/02
See application file for complete search history.

(56) References Cited

U.S. PATENT DOCUMENTS 7,959,847 B2    6/2011    Wicker et al.
8,260,589 B1    9/2012    Kumar
(Continued)

FOREIGN PATENT DOCUMENTS

CN    101344723 A    1/2009
JP    H09-94883 A    4/1997

OTHER PUBLICATIONS

Yoshiaki Kanamori et al., "Polymer microstructure generated by laser stereo-lithography and its transfer to silicon substrate using reactive ion etching," Microsyst Technol, vol. 13; Issue 8-10, Jan. 25, 2007, pp. 1411-1416, Springer-Verlag 2007, Available at: <dl.acm.org/citation.cfm?id=1284816>.

*Primary Examiner* — Ryan M Ochylski
(74) *Attorney, Agent, or Firm* — HP Inc. Patent Department

(57) ABSTRACT

An example method for constructing a three-dimensional object in accordance with aspects of the present disclosure includes projecting an image of a section of a three-dimensional object on a building plane through a projection unit, forming a cured section by irradiating laterally an interface of a photopolymerizable material on the building plane with light corresponding to the image of the section of the three-dimensional object, moving a support plane laterally to detach the cured section from the building plane resulting in a gap between the cured section and the building plane, and filling the gap between the cured section and the building plane with photopolymerizable material.

13 Claims, 3 Drawing Sheets

(51) Int. Cl.
  *B29C 64/124* (2017.01)
  *B29C 64/135* (2017.01)
  *B29C 64/386* (2017.01)
  *B33Y 10/00* (2015.01)
  *B33Y 30/00* (2015.01)
  *B29K 101/00* (2006.01)

(52) U.S. Cl.
  CPC .......... *B29C 64/386* (2017.08); *G03F 7/0037* (2013.01); *B29K 2101/00* (2013.01); *B33Y 10/00* (2014.12); *B33Y 30/00* (2014.12)

(56) References Cited

U.S. PATENT DOCUMENTS

| | | |
|---|---|---|
| 2003/0090752 A1* | 5/2003 | Rosenberger .......... B33Y 30/00 359/15 |
| 2004/0005374 A1 | 1/2004 | Narang et al. |
| 2008/0243284 A1 | 10/2008 | Grishaber et al. |
| 2010/0156003 A1 | 6/2010 | Wahlstrom |
| 2010/0206860 A1 | 8/2010 | Chua et al. |
| 2012/0326356 A1 | 12/2012 | Martin |

* cited by examiner

THREE-DIMENSIONAL OBJECT CONSTRUCTION

BACKGROUND

Rapid prototyping (RP) technologies such as layered manufacturing and other similar technologies enable the manufacture of complex three-dimensional (3D) parts. Rapid prototyping technologies, in particular, generally construct parts by building one layer at a time for use in, for example, the toy, automotive, aircraft and medical industries. Prototypes made by rapid prototyping technologies aid in research and development and provide a low cost alternative to traditional prototyping.

One method of RP technologies uses a chemical process called photopolymerization. Photopolymerization is primarily used in RP technologies to produce a solid part from a liquid. When building 3D objects using photopolymerization a vat of liquid photopolymer is placed under a digital light processing (DLP) projector or a laser scanner. The exposed liquid polymer hardens. The build plate then moves up or down in small increments and the liquid polymer is again exposed to light. The process repeats until the model has been built.

Stereolithography is one of the most widely used RP technologies used for producing models, prototypes, patterns, and production parts. Stereolithography, a 3D printing technology, employs a vat of liquid photopolymer resin and an ultraviolet laser to build parts' layers one at a time. For each layer, the laser beam traces a cross-section of the part pattern on the surface of the liquid resin. Exposure to the ultraviolet laser light cures and solidifies the pattern traced on the resin and joins it to the layer below.

In conventional stereolithography systems, a support plate is provided within a container filled with photopolymerizable or light-hardenable material, wherein a layer at the surface of the material is selectively irradiated, e.g. by means of a scanning laser beam, until a defined layer thickness is hardened. After hardening a layer, the support plate is lowered by the following layer thickness, and a new non-hardened material is applied.

The resolution of stereolithography machines and the ability of stereolithography to manufacture highly complex 3D objects, make stereolithography ideal for building both functional and non-functional prototypes.

BRIEF DESCRIPTION OF THE DRAWINGS

Example implementations are described in the following detailed description and in reference to the drawings, in which.

DETAILED DESCRIPTION

Figure 1:
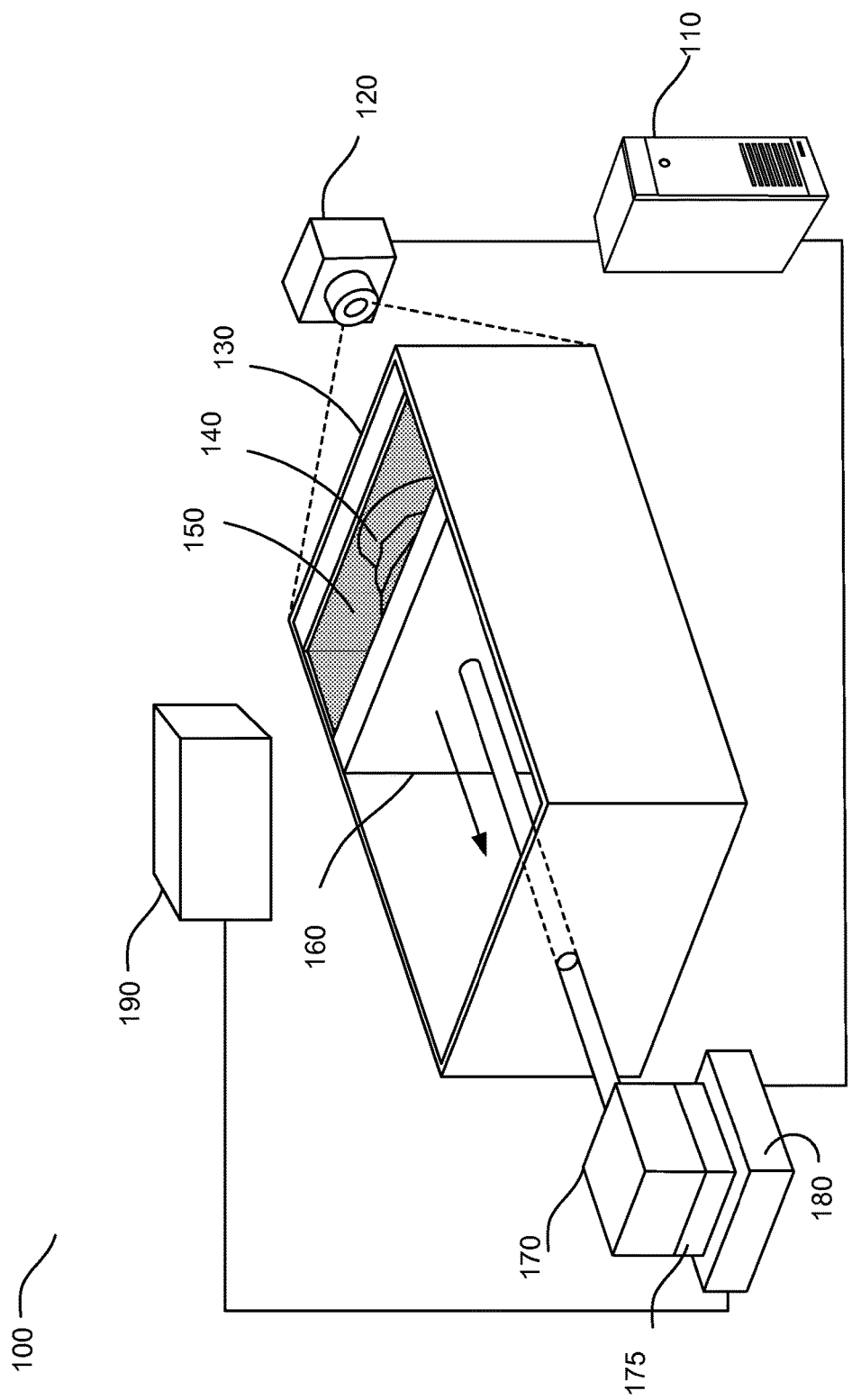
FIG. 1 illustrates a perspective view of an example stereolithography system in accordance with an implementation.

Various implementations described herein are directed to producing three-dimensional objects. More specifically, and as described in greater detail below, various aspects of the present disclosure are directed to a manner by which a three-dimensional object is produced by using a stereolithography system with modified projection geometry.

Aspects of the present disclosure described herein move a carrier platform sideways, resulting in a fill flow of material synchronized with the build speed. Among other things, this approach may provide a continuous material reflow enabling an uninterrupted, as opposed to layer-wise, stereolithographic process. According to various aspects of the present disclosure, the approach described herein reduces the need of solid support structures for the parts build and enables continuous layer-independent building processes. This may simplify implementations of three-dimensional object production by minimizing the material layering overhead to reduce part building times. Accordingly, this enables higher build speeds.

Moreover, aspects of the present disclosure described herein render a window into which an exposure image is projected. The window is separate from a surface of photopolymers. Among other things, this approach eliminates the effects of irregularities on the material surface, such as convexity or concavity of the material, on the building plane. Thus, stabilization of the resin surface through a wiper can be omitted, improving resin layering time and system throughput.

In one example in accordance with the present disclosure, a method for constructing a three-dimensional object is provided. The method comprises projecting an image of a section of a three-dimensional object on a building plane through a projection unit, forming a cured section by irradiating laterally an interface of a photopolymerizable material on the building plane with light corresponding to the image of the section of the three-dimensional object, the cured section being in between the building plane and a support plane, moving the support plane laterally to detach the cured section from the building plane resulting in a gap between the cured section and the building plane, and filling the gap between the cured section and the building plane with photopolymerizable material.

In a further example in accordance with the present disclosure, a stereolithography system for constructing a three-dimensional object is provided. The system comprises a projection unit to project an image of a section of a three-dimensional object on a building plane, a lateral movable support plane, a building plane to form a cured section by irradiating laterally an interface of a photopolymerizable material on the building plane with light corresponding to the image of the section of the three-dimensional object, the cured section being in between the building plane and the lateral movable support plane, a motor for moving the support plane laterally to detach the cured section from the building plane resulting in a gap between the cured section and the building plane and a controller to control the motor based on the three-dimensional object.

In another example in accordance with the present disclosure, a non-transitory computer-readable medium is provided. The non-transitory computer-readable medium comprises instructions that when executed cause a device to (i) project an image of a section of a three-dimensional object on a building plane through an optical element, (ii) form a cured section by irradiating laterally an interface of a photopolymerizable material on the building plane with light corresponding to the image of the section of the three-dimensional object, the cured section being in between the building plane and a support plane, (iii) move the support plane laterally to detach the cured section from the building plane resulting in a gap between the cured section and the building plane, and (iv) fill the gap between the cured section and the building plane with photopolymerizable material.

FIG. 1 illustrates an example stereolithography system 100 in accordance with an implementation. The system 100 comprises an arrangement wherein the projection occurs laterally instead of irradiating from above or below, and the support plate moves side-ways. The system 100 comprises an image provider 110, a projection unit 120, a building plane 130, a resin retaining receptacle 150, a lateral movable platform 160, a motor 170 with an encoder 175, a controller 180 and a material dispenser 190, each of which is described in greater detail below. It should be readily apparent that the system 100 depicted in FIG. 1 represents a generalized illustration and that other components may be added or existing components may be removed, modified, or rearranged without departing from a scope of the present disclosure. For example, while the system 100 illustrated in FIG. 1 includes only one material dispenser, the system may actually comprise a plurality of material dispenser, and only one has been shown and described for simplicity.

The image provider 110 may be a computer comprising a database of exposure images that may be used to build a part 140. In one implementation, a precise mathematical and geometric description of the desired structure's shape is input into one of many computer-aided design (CAD) programs. This file may be imported into a stereolithography machine-specific program (rapid prototyping program). The build parameters for the desired part are translated into machine language. Finally, the machine language may be used to build the part 140. As non-limiting examples, the computer may be configured as any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information.

In some implementations, a user may interact with the system 100 by controlling a keyboard, which may be an input device for the computer. Moreover, a user interface may refer to the graphical, textual and auditory information a computer program may present to the user, and the control sequences (such as keystrokes with the computer keyboard) the user may employ to control the program (e.g., CAD programs). The user interface may facilitate interactions between the user and the system 100 by inviting and responding to user input and translating tasks and results to a language or image that the user can understand.

It should be noted that the computer is intended to be representative of a broad category of data processors. The computer may include a processor and memory and help translate input received by the keyboard. In one implementation, the computer may include any type of processor, memory or display. Additionally, the elements of the computer may communicate via a bus, network or other wired or wireless interconnection.

The processor may retrieve and execute instructions stored in the computer readable medium. The processor may be, for example, a central processing unit (CPU), a semiconductor-based microprocessor, an application specific integrated circuit (ASIC), a field-programmable gate array (FPGA) configured to retrieve and execute instructions, other electronic circuitry suitable for the retrieval and execution instructions stored on a computer readable storage medium, or a combination thereof. The processor may fetch, decode, and execute instructions stored on the storage medium to operate the computer in accordance with the above-described examples. The computer readable medium may be a non-transitory computer-readable medium that stores machine readable instructions, codes, data, and/or other information.

Further, the computer readable medium may participate in providing instructions to the processor for execution. The computer readable medium may be at least one non-volatile memory, a volatile memory, and/or at least one storage device. Examples of non-volatile memory include, but are not limited to, electronically erasable programmable read only memory (EEPROM) and read only memory (ROM). Examples of volatile memory include, but are not limited to, static random access memory (SRAM) and dynamic random access memory (DRAM). Examples of storage devices include, but are not limited to, hard disk drives, compact disc drives, digital versatile disc drives, optical devices, and flash memory devices.

It should be readily apparent that the image provider 110 illustrated in FIG. 1 represents a generalized depiction and in other implementation, other image providers may be used or that other components may be added or existing components may be removed, modified, or rearranged without departing from a scope of the present disclosure.

In one implementation, the projection unit 120 includes a series of optics and a controllable light beam to solidify a photopolymer resin. In another implementation, the projection unit 120 may be a regular video projector providing enough UV light to initiate a photochemical reaction by cleaving a molecule to form free radicals when white light is emitted. The free radicals may polymerize a monomer through an additional polymerization reaction. It may polymerize the solution, becoming solid, only where the white light is projected. It may remain an unreacted liquid elsewhere. Successive sections may be made by moving the polymerized shape laterally. A layer of photopolymerizable material (e.g., resin) may flow into the gap between the part 140 and the building plane 130 and light may be kept projected to solidify portions of the fresh level. This may be repeated, creating a three dimensional object sections.

In one implementation, the projection unit may be a digital light processing (DLP) projector by Texas Instruments that uses a digital micromirror device. In other implementations, different types of projectors including light-crystal displays (LCD) may be utilized. The system 100 may utilize the projector to shine an image onto a section of photo-initiated polymer resin, which results in a quick solid cure of the entire section in one operation. In one implementation, the section thickness is typically 100 microns (0.1 mm). In other implementation, the sections may be sliced at different measurements. In one implementation, a software package may be used to analyze the part before building and rotate it in a manner that it minimizes the number of distinct sections needed during the construction of the part.

In one implementation, the DLP projector may comprise a digital micromirror device (DMD). When coordinated with a digital video or graphic signal (e.g., data from the image provider 110), a light source, and a projection lens, the DMD mirrors can reflect a digital image onto the building plane 130. Each mirror may represent at least one pixel in the exposed image. The number of mirrors may correspond to the resolution of the exposed image.

The building plane 130 may be provided in form of a suitable transparent material. In one implementation, the building plane 130 may be a window receiving the exposure image from the projection unit 120. The side of the window facing the resin retaining receptacle 150 and in contact with the liquid resin may be coated with a silicon membrane that prevents resin from sticking to the window once cured. In another implementation, the window may be a quartz window that is transparent to light. The UV light from the projection unit 120 may be projected through the building plane 130 in accordance with data about the three-dimensional shape of the three-dimensional object sliced into sections of a predetermined thickness in the lamination direction.

The resin retaining receptacle 150 can be arranged for carrying the curable material supplied from the material dispenser 190 and the part 140. The resin retaining receptacle 150 may hold liquid UV-curable photopolymer resin, and the interior of the resin retaining receptacle 150 may be large enough to build parts in various heights and depth.

The building plane 130 into which the exposure image is projected is different from the fluid surface of the UV-curable resin in the resin retaining receptacle 150 and not affected by it. Irregularities on the material surface, such as convexity or concavity of the material, do not affect the building plane. Thus, stabilization of the resin surface through a wiper can be omitted, improving resin building time and system throughput.

The lateral movable platform 160 (e.g., support plate) may be a lateral movement plate movable in a horizontal direction orthogonal to the interface of the resin. While the part 140 is being built, it is attached to and supported by the lateral movable platform 160. The lateral movable platform 160, in turn, may be attached to a horizontal elevator which may be controlled by a precision lead screw driven by a stepper motor 170 controlled by the controller 180. The part 140 is movable between the lateral movable platform 160 and the building plane 130 by the horizontal drive mechanism. The horizontal drive mechanism may be implementable by a known drive mechanism such as, for example, a ball screw In one implementation, the lateral movable platform 160 may be optionally adapted to rotate about a horizontal axis for angled part and circuitry building. Such rotation may be tilting of the platform 160 with respect to a building screw. In another implementation, the tilting may be adapted to rotate about a vertical axis. It should further be understood that although FIG. 1 does not depict intermediate washing and/or curing units, a system which accommodates intermediate washing and/or curing may also be employed.

In one implementation, the motor 170 may be a stepper motor (or step motor) that may be a brushless DC electric motor that divides a full rotation into a number of equal steps.

The control unit 180 synchronizes the movement of the motor 170 with the data from the image provider 110. The control unit 180 may serve as an interface between the motor 170 and the computer. The control unit 180 may include a processing device that may be adapted to receive data from the image provider 110, process the data, and generate commands based on the processed data. Such processed data may comprise device data indicating functions responsive to the exposure image of the part 140. In one implementation, the processed data may be in the form of numeric data called scan codes. In one implementation, the control unit 180 may be a stand-alone device (as illustrated in FIG. 1). In another implementation, the control unit 180 may be implemented in the image provider 110 (e.g., computer). Furthermore, in some implementations, the control unit 180 may be implemented using embedded controllers that may run specialized controller program. In other implementations, the control unit 180 may be implemented using multifunction I/O devices, such as a "Super I/O" device.

The control unit 180 receives data from the encoder 175 and issues a command accordingly. The data may comprise the current location of beam attached to the lateral movable platform 160 on one end and the motor 170 on the other end. The control unit 180 may compare that data with the desired location data it may receive from the image provider 110 and in response may issue a command accordingly. Based on the command from the controller, the motor 170 may move the beam to the desired location.

In one implementation, the system 100 may function in a layer-by-layer build mode. In another implementation, the system 100 may function in a continuous build mode. In the continuous operation mode, the hardening of the photopolymer at a given point may be determined by the relative speed between the building plane 130 and the lateral movable platform 160 and the irradiation intensity of the corresponding pixel. This additional control parameter improves the build flexibility and permits the optimization of the curing performance. It should be noted that building in continuous mode improves speed and potentially resolution in build direction.

The material dispenser 190 may supply a prescribed amount of liquid UV-curable photopolymer resin to the resin retaining receptacle 150 for the creation of the part 140. The liquid composition may be stored in the material dispenser 190.

The material dispenser 190 may be synchronized with the image provider 110 via the controller 180. In one implementation, the material dispenser 190 may function in a continuous flow mode. The continuous material reflow may enable an uninterrupted, as opposed to layer-wise, stereolithographic process. Accordingly, such process may be worked with any high resolution in build direction. Three-dimensional objects having no separate layers or insignificant interfaces between separately hardened portions may be provided. Such process may improve the mechanical properties and surface roughness of the part being built (i.e., part 140). Moreover, the reflow or material supply may not need to be assisted. Further, the alternating or periodic horizontal movement of a blade, a wiper or a slider in a defined height above the building plane 130 to eliminate a convex or concave curving of the material and reestablish the required planarity, can be omitted.

During or at the end of each exposure cycle, the motor 170 may move the lateral movable platform 160 sideways using the beam, either continuously or positioning for the next section. In the process, the already polymerized area of the part 140 on the building plane 130 may come off the building plane 130, and fresh material which is not yet polymerized may flow freely and fill the gap produced between the building plane 130 and the part 140 that occurred when the part 140 may detached from the building plane 130.

The liquid composition in the resin retaining receptacle 150 supplied from the material dispenser 190 applied to a uniform thickness so that the composition is extended over to the side of the part 140 in the gap between the building plane 130 and the part 140. The new cured section is formed on the previously cured section by irradiating with the UV beams from the projection unit 120.

The amount of resin supply in a single supply operation is adjustable. The amount may be appropriately determined depending on the size of the gap between the building plane 130 and the part 140, the type of resin and the shape of the cross-section being created. In one implementation, a dispenser sensor (not shown in FIG. 1) may be used. The sensor may detect the level of liquid in the resin retaining receptacle 150. In one implementation, the sensor may be a surface level detector which may include a float or the like, and may be located in the rear of the resin retaining receptacle 150. The surface level detector may detect and compare the resin level with a predetermined level. For example, the level of liquid may be set to not exceed above the area of the projection from the projection unit 120 on the building plane 130. The material dispenser 190 may be set to refill up to the predetermined level for the liquid and maintain the surface at the predetermined level, which may preferably be the focus plane of the UV light from the projection unit 120.

Based on the comparison performed by the detector, the control unit 180, if the level is too low, may issue a command for the material dispenser 190 to maintain a resin flow, displacing some resin until the level is correct. If the level is too high, the control unit 180 issues a command to put the resin flow on hold until the resin level is correct. In another implementation, a hose for pumping out liquid material may be used to maintain a proper liquid level relative to the fixed frame. Such hose may be controlled by the control unit 180 and may be raised and lowered into resin retaining receptacle 150, thereby raising and lowering the liquid level.

In another implementation, the sensor may be omitted. In such implementation, the fill flow may be synchronized with the build speed. Variations of the fill level do not affect the building plane 130. The fill level, which is the position of the resin surface, may not be relevant for the build of the part 140 as long as the level exceeds the part 140's z-dimension. Further, as illustrated in FIG. 1, the lateral projection approach may minimize the need of any artificial support structures for the part 140 and thus may automatically reduce the cost of the part 140.

In another implementation, instead of the liquid resin, the system 100 may use any material capable to flow into the gap created by the movement of the building plane 130 away from the part 140. For example, in one implementation, powder based systems like plastic or metal may be used.

Figure 2:
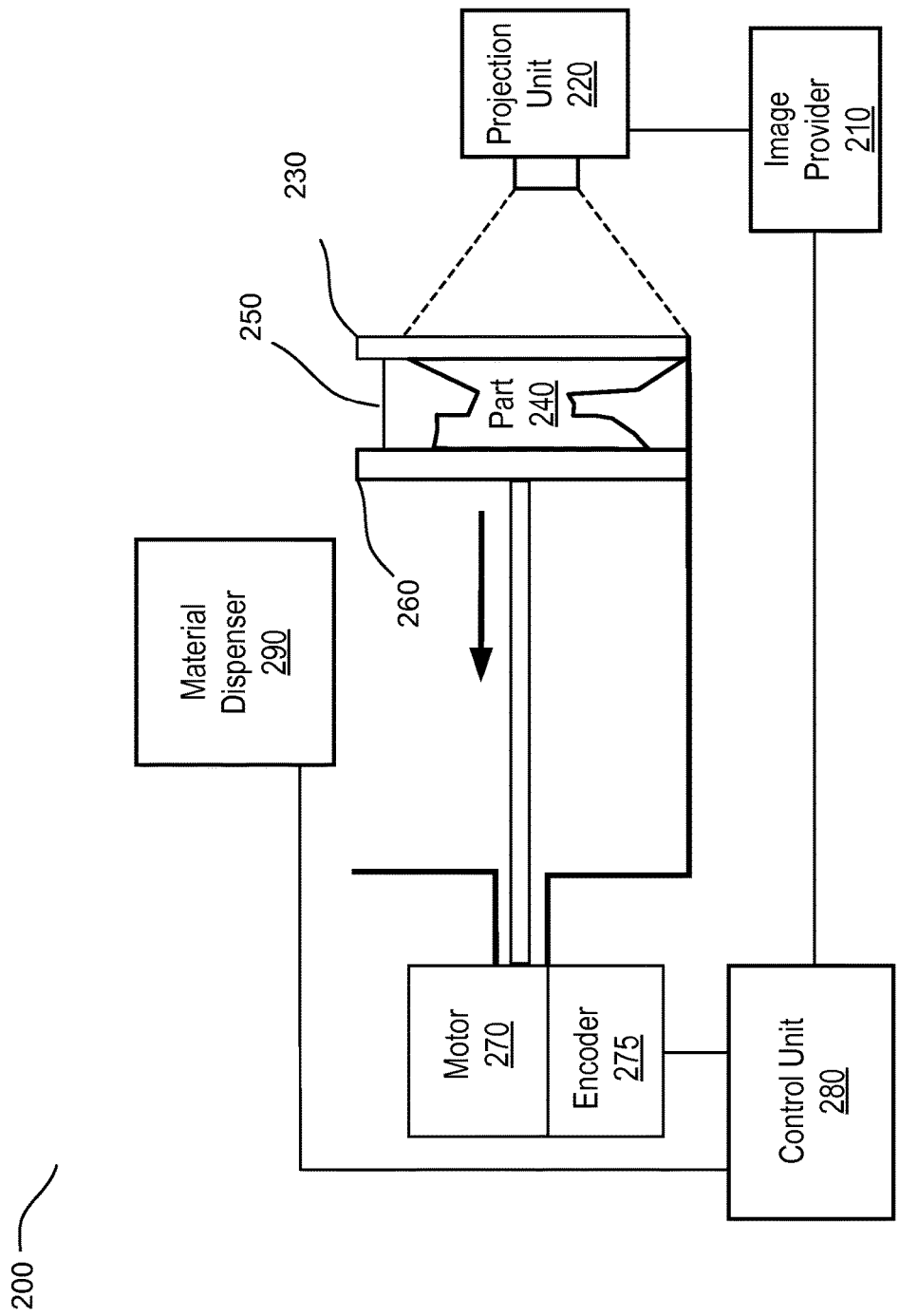
FIG. 2 illustrates example components of an example stereolithography system in accordance with an implementation.

FIG. 2 illustrates various components of an example system 200 in accordance with an implementation. The system 200 represents a system similar to the system 100 discussed above in more detail in reference to FIG. 1. Similar to the system 100, the system 200 comprises an image provider 210 (corresponding to the image provider 110 in FIG. 1), a projection unit 220 (corresponding to the projection unit 120 in FIG. 1), a building plane 230 (corresponding to the building plane 130 in FIG. 1), a resin retaining receptacle 250 (corresponding to the resin retaining receptacle 150 in FIG. 1), a lateral movable platform 260 (corresponding to the lateral movable platform 160 in FIG. 1), a motor 270 (corresponding to the motor 170 in FIG. 1) with an encoder 275 (corresponding to the encoder 175 in FIG. 1), a controller 280 (corresponding to the controller 180 in FIG. 1) and a material dispenser 290 (corresponding to the material dispenser 190 in FIG. 1), each of which is described in greater detail above. Similar to the system 100, it should be readily apparent that the system 200 depicted in FIG. 2 represents a generalized illustration and that other components may be added or existing components may be removed, modified, or rearranged without departing from a scope of the present disclosure. For example, while the system 200 illustrated in FIG. 2 includes only one material dispenser, the system may actually comprise a plurality of material dispenser, and only one has been shown and described for simplicity.

In one implementation, major components of the stereolithography system 200 include a control module, process module, and service module. The process module may contain an electronic assembly. The electronic assembly may comprise a rack which may be utilized to house the image provider 210 (e.g., a computer), the projection unit 220, the control unit 280, the motor 270 with the encoder 275, the material dispenser 290 and other driver electronics (not shown). The control unit 280 and the computer configuration may communicate to the workstation configuration by means of an Ethernet local area network or the like. The computer configuration may include the following: a microprocessor, a memory, and various other processing components.

The service module may contain a power input, a heating unit, and/or a blower. The heating unit may be used to heat the resin retaining receptacle 250 to maintain the liquid resin at an optimum, user-specified temperature. The blower may be used to circulate air in the process module. These parts may be placed in a separate module to minimize the possibility of vibration and electromagnetic noise from reaching the process module.

Figure 3:
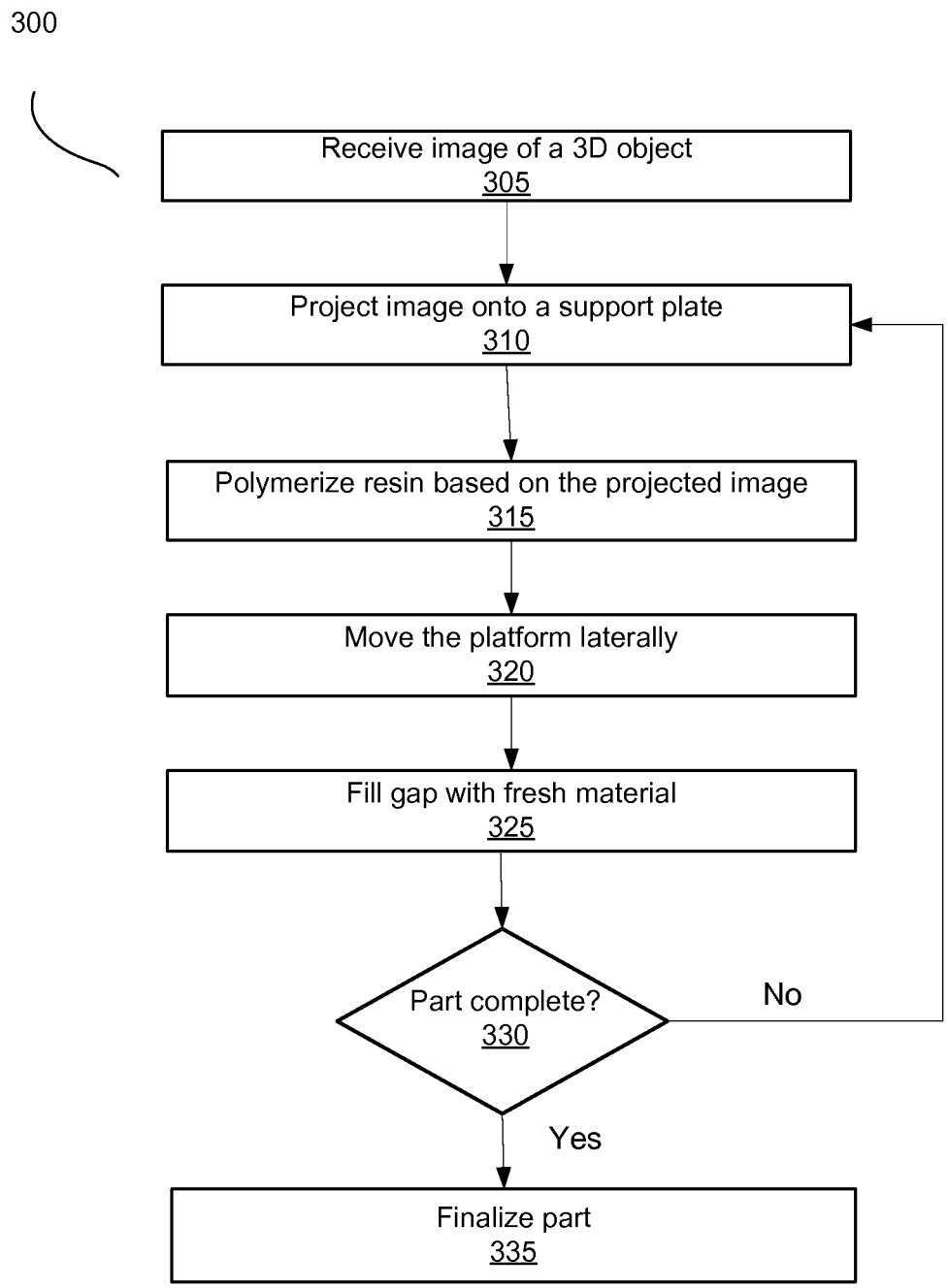
FIG. 3 illustrates an example process flow diagram in accordance with an implementation.

Turning now to the operation of the system 100, FIG. 3 illustrates an example process flow diagram 300 in accordance with an implementation. It should be readily apparent that the processes illustrated in FIG. 3 represents generalized illustrations, and that other processes may be added or existing processes may be removed, modified, or rearranged without departing from the scope and spirit of the present disclosure. Further, it should be understood that the processes may represent executable instructions stored on memory that may cause a processor to respond, to perform actions, to change states, and/or to make decisions. Thus, the described processes may be implemented as executable instructions and/or operations provided by a memory associated with the system 100. Alternatively or in addition, the processes may represent functions and/or actions performed by functionally equivalent circuits like an analog circuit, a digital signal processor circuit, an application specific integrated circuit (ASIC), or other logic devices associated with the system 100. Furthermore, FIG. 3 is not intended to limit the implementation of the described implementations, but rather the figure illustrates functional information one skilled in the art could use to design/fabricate circuits, generate programs, or use a combination of hardware and software which are machine readable instructions to perform the illustrated processes.

The process 300 may begin at block 305, where an image of a three-dimensional object is received. As discussed in more detail above with respect to FIG. 1, the image data is received from an image provider. In particular, this process may involve the system reading the design of the three-dimensional object from a computer file to build the part continuously from a series of cross sections. This step further involves producing the 2D image as the build section. More specifically, the 3D image is sliced in the build direction. In one implementation, the image may be sliced in less than 100 um steps in thickness. In another implementation, the step may further involve calibration to compensate for any build part shrinkage and modifying the 2D slice. This may further involve modifying the light intensities in different locations of the 2D slices to provide the right curing levels. In one implementation, data in each section may be modified to take into account the interactions between sections, compensate aberrations of the optical system, compensate for meniscus growth and other edge effects, and create internal structures not included in a software file (e.g., a CAD file) but delivered through software components.

At block 310, a projection unit projects the received image onto a building plane, one side of which faces the resin retaining receptacle and is in contact with the liquid resin. As discussed in more detail above with respect to FIG. 1, the side touching the liquid resin may be coated with a silicon membrane that prevents resin from sticking to the window once cured.

At block 315, the UV light from the projection unit may be projected through the building plane to polymerize the resin on the surface of the building plane in accordance with the image data of the three-dimensional object.

At block 320, once the exposed image section is polymerized, the system proceeds to move the lateral movable platform laterally, which results in detaching the already polymerized area of the part on the building plane off the building plane. In particular, this process may involve the control unit issuing a command to the motor to move the lateral movable platform laterally. As part of the process of issuing commands, the controller may receive data from the encoder and issues a command accordingly. As discussed in more detail above with respect to FIG. 1, the data may comprise the current location of the lateral movable platform. The control unit may compare that data with data related to the desired location of the lateral movable platform, and in response may issue a command accordingly. Based on the command from the controller, the motor may move the lateral movable platform to the desired location.

At block 325, fresh material (i.e., resin) which is not yet polymerized flows freely and fills the gap produced between the building plane and the part being built when the part is detached from the building plane.

At block 330, the system checks to determine if the part is complete based on the image from the image provider. If the part is found to be incomplete, the system continues with the process described in block 310. In one implementation, the process repeats continuously as the part is built based on the projected image from the projection unit. During or at the end of each exposure cycle, the lateral movable platform may be moved laterally, either continuously or positioning for the next section.

In the event that the three-dimensional object is built completely, at block 335, the part is finalized. In particular, the finalization process may involve detaching the part from the platform, removing the part from the machine, cleaning and/or washing to remove any extra curing material, and then post-curing. Further, this process may additionally involve sanding, filing or using some other finishing technique on the part in order to provide a specific surface finish to the structure, which may include painting, plating and/or coating the surface. Additionally or in alternative, the part is post-cured (typically exposed to UV) prior to completion.

The present disclosure has been shown and described with reference to the foregoing example implementations. It is to be understood, however, that other forms, details, and examples may be made without departing from the spirit and scope of the disclosure that is defined in the following claims. As such, all examples are deemed to be non-limiting throughout this disclosure.

What is claimed is:

1. A method for constructing a three-dimensional object, comprising:
    projecting an image of a section of a three-dimensional object on a building plane through a projection unit;
    forming a cured section by irradiating laterally an interface of a photopolymerizable material on the building plane with light corresponding to the image of the three-dimensional object, the cured section being in between the building plane and a support plane;
    continuously moving the support plane laterally throughout formation of the three-dimensional object to continuously move the cured section away from the building plane; and
    flowing additional photopolymerizable material between the cured section and the building plane to be irradiated to continuously build the three-dimensional object.

2. The method of claim 1, further comprising containing all the photopolymerizable material between the building plane and the support plane.

3. The method of claim 2, further comprising continuously adding photopolymerizable material between the building plane and the support plane with a material dispenser during building of the three-dimensional object.

4. The method of claim 1, further comprising detecting, with a sensor, a level of the photopolymerizable material in an area between the support plane and the building plane.

5. The method of claim 1, wherein projecting the image of the section of the three-dimensional object on the building plane through the optical element further comprises projecting the image laterally.

6. The method of claim 4, wherein the sensor comprises a float sensor on a surface of the photopolymerizable material.

7. The method of claim 1, further comprising heating the photopolymerizable material during building of the three-dimensional object.

8. The method of claim 1, further comprising pumping out photopolymerizable material to maintain a desired liquid level.

9. The method of claim 1, further comprising raising or lowering a hose for in the photopolymerizable material to adjust a level of the photopolymerizable material during building of the three-dimensional object.

10. The method of claim 1, wherein a speed of continuously moving the support plate is synchronized with a speed of curing the photopolymerizable material.

11. A non-transitory computer-readable medium comprising instructions that when executed cause a stereolithography system to:
    project an image of a section of a three-dimensional object on a building plane through an optical element;
    form a cured section by irradiating laterally an interface of a photopolymerizable material on the building plane with light corresponding to the image of the section of the three-dimensional object, the cured section being in between the building plane and a support plane; continuously move the support plane laterally throughout formation of the three-dimensional object to continuously move the cured section away from the building plane; and
    allow additional photopolymerizable material to flow between the cured section and the building plane to be irradiated to continuously build the three-dimensional object.

12. The non-transitory computer-readable medium of claim 11, wherein the cured section is separated from the building plane by moving the support plane in a horizontal direction until separation is detected.

13. The non-transitory computer-readable medium of claim 11, wherein the building plane is different from a surface of the photopolymerizable material, and wherein the building plane is not affected by any irregularities on the surface of the photopolymerizable material, the irregularities comprising at least one of convexity and concavity of the photopolymerizable material.

* * * * *